United States Patent
Su et al.

(10) Patent No.: US 7,713,453 B2
(45) Date of Patent: May 11, 2010

(54) METHOD FOR FABRICATING MICROLENSES AND PROCESS OF SINGLE PHOTOMASK PATTERN-BASED PHOTOLITHOGRAPHY

(75) Inventors: Guo-Dung Su, Taipei (TW); Hsin-Ta Hsieh, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/356,459

(22) Filed: Jan. 20, 2009

(65) Prior Publication Data

US 2009/0267249 A1 Oct. 29, 2009

(30) Foreign Application Priority Data

Apr. 29, 2008 (TW) .............................. 97115631 A (51) Int. Cl.
*B29D 11/00* (2006.01)
(52) U.S. Cl. .................. 264/2.5; 264/1.36; 264/297.4; 264/297.8; 264/297.2
(58) Field of Classification Search ............... 264/1.36, 264/2.5, 297.4, 297.8, 297.2
See application file for complete search history.

(56) References Cited

U.S. PATENT DOCUMENTS 6,385,997 B1 * 5/2002 Nelson et al. ............... 65/64
7,351,520 B2 * 4/2008 Lee et al. .................... 430/321
2008/0144192 A1 * 6/2008 Choi et al. .................. 359/754

OTHER PUBLICATIONS

Hsin-Ta Hsieh et al.; "A fabrication technique for microlens array with high fill-factor and small radius of curvature"; SPIE Photonics West 2008; Conference 6883; 12 pages.

* cited by examiner

*Primary Examiner*—Joseph S Del Sole
*Assistant Examiner*—David N Brown, II
(74) *Attorney, Agent, or Firm*—Peter F. Corless; Steven M. Jensen; Edwards Angell Palmer & Dodge LLP (57) ABSTRACT

A method for fabricating micro-lenses and a method for fabricating micro-lenses by photolithography are provided. The method includes forming a plurality of micro-cavities in a substrate, filling lens material into each of the micro-cavities, and heating the lens material, thereby reflowing the lens material so as to form a plurality of micro-lenses in the substrate. The micro-cavities define a boundary of each of the micro-lenses formed by reflowing the lens material, thereby preventing adjacent micro-lenses from fusing together by reflowing when overheated. The process uses negative photoresist and positive photoresist as micro-cavities and lens material respectively, thereby streamlining the fabrication method and its steps.

18 Claims, 9 Drawing Sheets

METHOD FOR FABRICATING MICROLENSES AND PROCESS OF SINGLE PHOTOMASK PATTERN-BASED PHOTOLITHOGRAPHY

BACKGROUND OF THE INVENTION

1. Field of the Invention

The present invention relates to a method for fabricating micro-lenses, and more particularly, to a method for fabricating micro-lenses by photolithography.

2. Description of Related Art

Presently, micro-lens array has been widely used in the field of image sensor design, such as CCD (charged coupling device) image sensor, and CMOS (complementary metal oxide semiconductor) sensor.

The objective of either the CCD image sensor or CMOS image sensor is to increase the incident light quantity per pixel so as to increase the sensing ability of the image sensor. Micro-lens array technique is frequently used in conjunction with the micro-lens array of the light sensing part per pixel, thereby raising the sensing ability of the high pixel sensing part.

In particular, the frequently-seen manufacturing method of the micro-lens array structure uses polymer thermal reflow to form all kinds of the required micro-lens shapes. However, as the pixel size shrinks or the pixel density increases, the gap between the adjacent micro-lenses will be too small and the temperature of the micro-lens substrate will be non-uniform, thereby causing problems such as incomplete lens thermal melting or improper thermal agglutinations between the adjacent micro-lenses in the conventional thermal reflow.

Figure 1A:
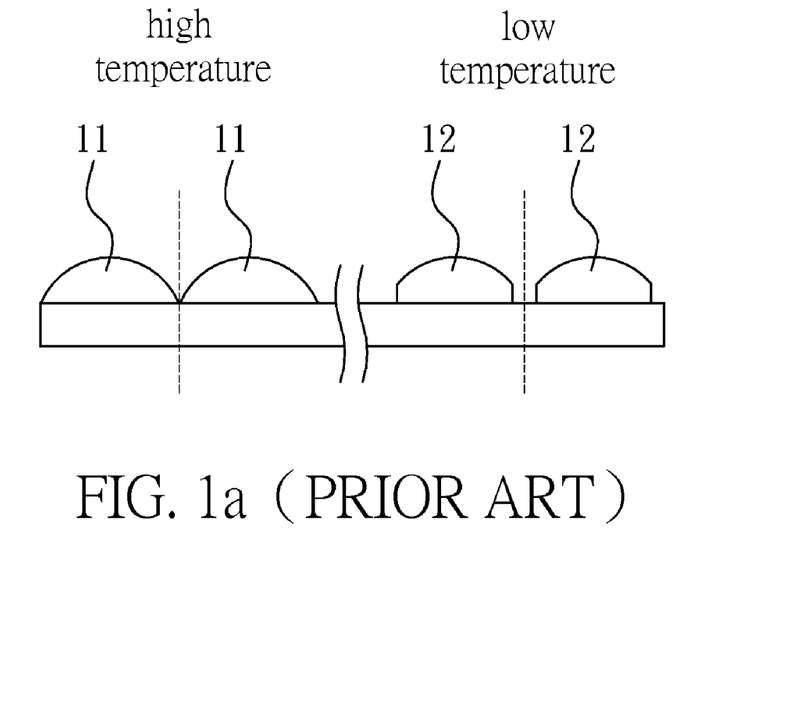
FIG. 1a is a first diagram of a conventional micro-lens thermal reflow process.

Referring to FIG. 1a, a first diagram of a conventional micro-lens thermal reflow process is illustrated. As shown in the diagram, when the micro-lens substrate is of non-uniform temperature, which is that the polymer material at a higher level of the substrate has been melted to form an ideal arc-shaped micro-lens 11 and the polymer material 12 at the lower temperature part of the substrate has not, an insufficient thermal reaction may occur, resulting in failure in forming an ideal arc-shaped lens of the polymer material.

Figure 1B:
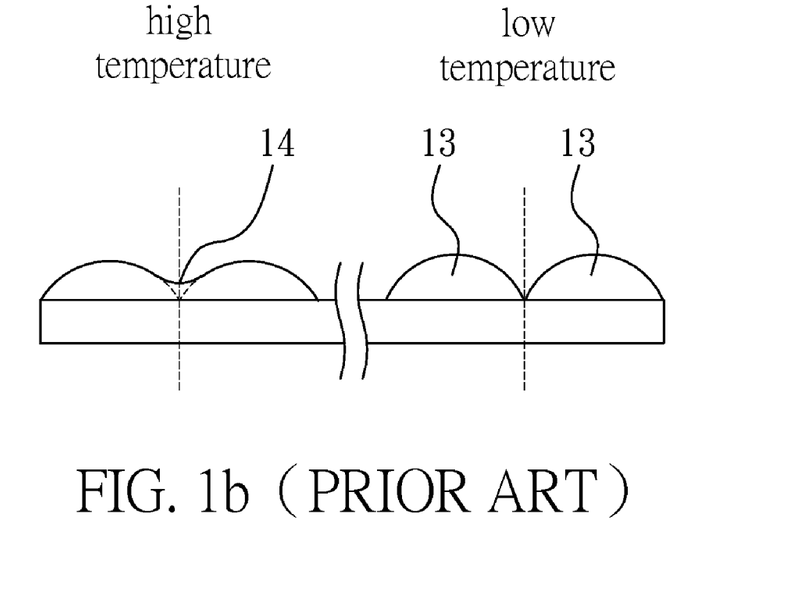
FIG. 1b is a second diagram of a conventional micro-lens thermal reflow process.

Referring now to FIG. 1b, a second diagram of a conventional micro-lens thermal reflow is illustrated. As shown in the diagram, if heating continues following the process of FIG. 1a, the polymer material located at the part of a lower temperature of the substrate can also achieve a sufficient thermal reaction to form an ideal arc-shaped lens 13 by being melted. On the other hand, the micro-lenses located at the higher temperature of the substrate could possibly be thermally fused with adjacent micro-lenses 14.

In summary, it has become an urgent issue for designers in the micro-lens design field to propose a micro-lens manufacturing method to avoid incomplete thermal fusing or problems of agglutinating the adjacent micro-lenses in the conventional thermal reflow due to the undersized interspace of the adjacent micro-lenses and the non-uniform temperature of the micro-lens substrate after the pixel size is shrunk or the pixel density is increased.

SUMMARY OF THE INVENTION

In view of the aforementioned conventional technical drawback, a micro-lens manufacturing method is provided, wherein a plurality of micro-cavities are formed in a substrate. Subsequently, lens material is filled in each of the micro-cavities and micro-lens thermal reflow is consequently used for heating so as to thermally melt each of the lens material to form a plurality of micro-lens in the substrate.

In addition, for the aforementioned micro-lens manufacturing method, a plurality of micro-cavities are arranged in an array and the plurality of micro-lenses are also arranged in an array corresponding to the array the micro-cavities. Besides, according to the actual user's requirements, both of the array of the micro-cavities and that of the micro-lens are either of a square shape or of a hexagonal array.

It is to be emphasized that the two steps of the micro-lens manufacturing method according to the present invention involving forming a plurality of micro-cavities in the substrate as well as filling lens material into each of the micro-cavities are allowed to adopt the technique of photolithography.

The procedure is to form a negative photoresist layer in the substrate and then makes use of a set of pattern-based photomask having micro-cavities array to perform photolithography on the negative photoresist layer, so as to form a plurality of micro-cavities surrounded by the negative photoresist on the negative photoresist layer. Subsequently, a positive photoresist layer is formed on the negative photoresist layer and then makes use of a set of pattern-based photomask having micro-cavities array to perform photolithography on the positive photoresist layer, so as to form positive photoresist lens material in each of the micro-cavities.

As for the structure of micro-cavities and lens material, there is no special limitation to the vertical height of lens material. In other words, the vertical height of lens material is adjustable according to the lens height determined by the user, thereby allowing it to protrude from the micro-cavities, align with the micro-cavities, or lie lower than the micro-cavities. Likewise, there is no special limitation to the horizontal cross-section of lens material and the micro-cavities. Lens material or the horizontal cross-section of the micro-cavities are configured to be either one of a circle, a hexagon, a rectangle and an irregular shape according to the horizontal cross-section of the lens determined by the user.

It is therefore known that the method for manufacturing the aforementioned micro-lenses discloses a boundary condition concept of lens thermal reflow defined by using micro-cavities. In the process of generating an ideal lens via the lens material performing thermal reflow function, a layer of micro-cavities for limiting the thermal lens material diffusion range is fabricated, thereby allowing the lens to appear as an ideal structure defined by the user after curing.

Also, design according to the present invention is applied to the large-scale micro-lens array thermal reflow process, thus the thermal agglutination problem resulted from high temperature thermal reflow between adjacent micro-lenses in the conventional technique can then be solved thereby increasing the heating temperature of the overall manufacturing system to allow the area of a lower temperature in the substrate of lens material to achieve sufficient heating temperature and allow the lens material to be applied with sufficient thermal response to be melted into an ideal arc-shaped lens.

In summary, the method for manufacturing micro-lenses that the present invention discloses overcomes the problems of the conventional thermal reflow process like incomplete thermal melting of the micro-lens or improper agglutination between adjacent micro-lenses due to undersized gaps between adjacent micro-lenses and non-uniform micro-lens substrate temperature.

Finally, after an ideal micro-lens array is manufactured using the micro-lens manufacturing method of the present invention, a layer of micro-lens molding layer is formed in the substrate covering the plurality of micro-lenses. Subsequently, after curing of the lens molding layer, the lens molding layer is separated from the micro-lens to obtain a lens molding layer having a surface corresponding to the micro-lens structure. The lens molding layer having a surface corresponding to the micro-lens structure is then used for micro-lens manufacturing.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The following embodiments further describe details of the terms of the present invention; however, the scope of the present invention is not restricted to any terms.

First Embodiment

Figure 2:
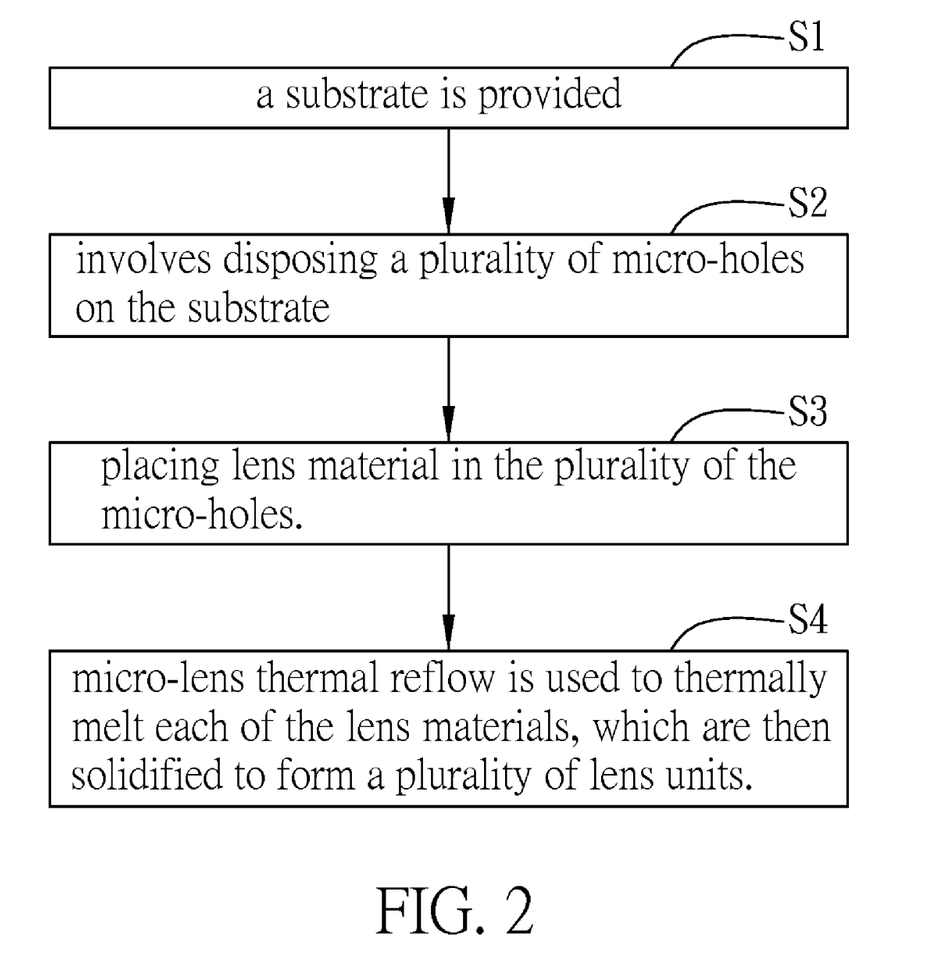
FIG. 2 is a flow process according to a first embodiment of the present invention.

FIG. 2 depicts a flow procedure according to a first embodiment of the present invention. As shown in the diagram, a method for manufacturing micro-lenses according to the present invention includes the following steps:

For step S1, a substrate is provided. Next, proceed to step 2. In the present embodiment, the substrate is preferably a semiconductor wafer. More preferably, the material of the substrate may be selected from the elemental semiconductor group consisting of silicon, germanium, and diamond. The material of the substrate may also be selected from the compound semiconductor group consisting of silicon carbide and galinium arsenide. The material of the substrate is further selected from the alloy semiconductor group selected from SiGe and SiCGe.

Step S2 involves disposing a plurality of micro-cavities in the substrate. Subsequently, step S3 is carried out. In the present embodiment, methods of forming the plurality of micro-cavities are dry-etching process or wet-etching process. Examples of dry-etching process are photolithography, ion beam etching, and plasma etching. Besides, the horizontal cross-section of the micro-cavities does not have any specific limitations and is configured according to the user's requirements as circular cross-section, hexagonal cross-section, and rectangular cross-section.

Step S3 is about filling lens material into the plurality of the micro-cavities. Move step S4 after performing step S3. In the present embodiment, the horizontal cross-section of the lens material does not have any specific limitations, and is configured according to the user's requirement. In addition, the height of the lens material is protruded from, aligned with or lower than the micro-cavity opening as required.

At step S4, micro-lens thermal reflow is used to thermally melt each of the lens materials, which are then solidified to form a plurality of micro-lens in the substrate.

Figure 3A:
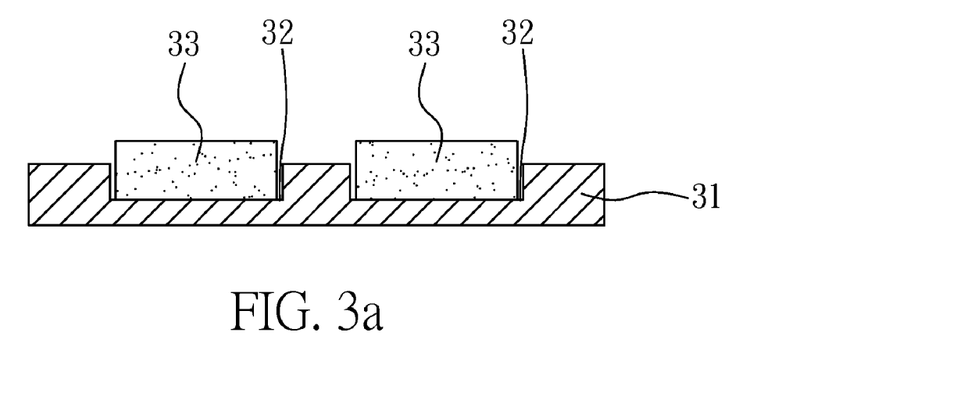
FIG. 3a is a cross-sectional diagram of a first manufacturing step of micro-lenses according to the present invention.
Figure 3B:
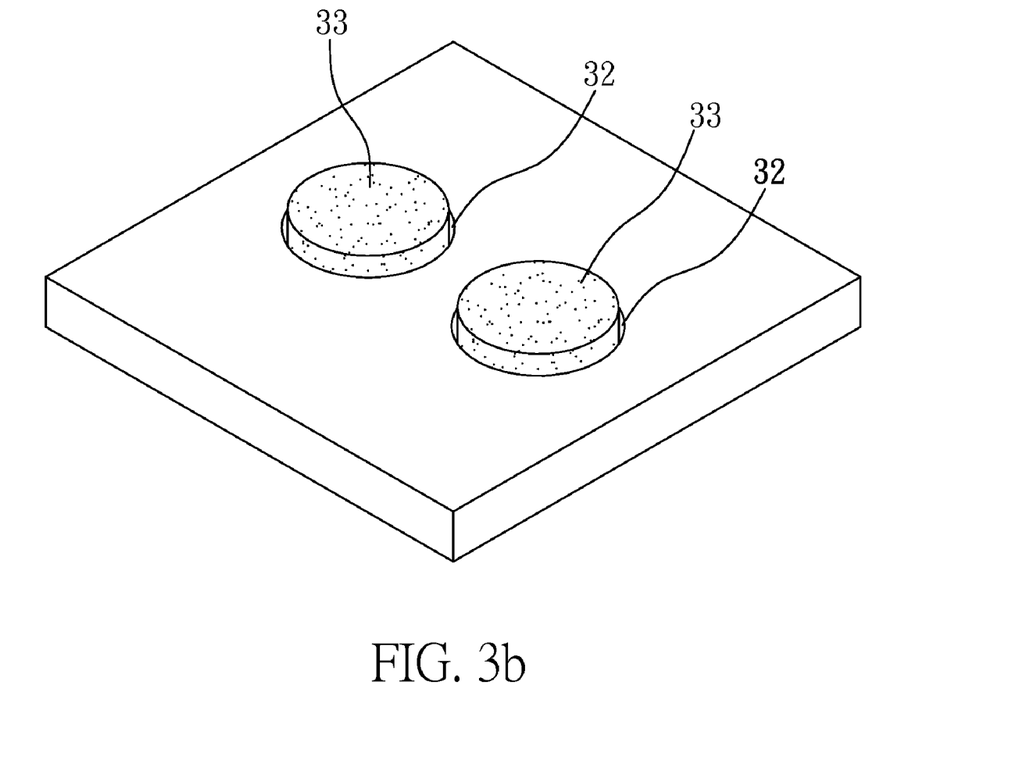
FIG. 3b is a side view of the first manufacturing step of the micro-lenses according to the present invention.

As for the manufacturing structure of the micro-lens according to the present invention, FIG. 3a illustrates a cross-sectional diagram of a first process of a micro-lens according to the present invention and FIG. 3b is a side view of the first process of the micro-lens according to the present invention. FIGS. 3a and 3b illustrate forming a micro-cavity 32 in the substrate 31 surface as well as forming lens material 33 in the micro-cavity 32. It is also to be specifically stressed that the shape of the cross-section of the micro-cavity 32 is not necessarily limited to a circle and the lens material 33 does not have to protrude from the micro-cavity 32. The height of the lens material is protruded from, aligned with or lower than the micro-cavity opening.

Figure 3C:
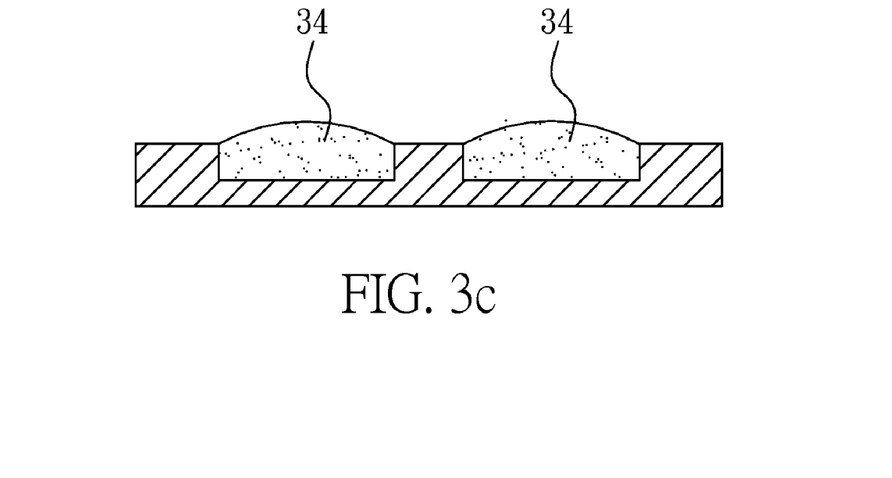
FIG. 3c is a cross-sectional diagram of a second manufacturing step of the micro-lenses s according to the present invention.
Figure 3D:
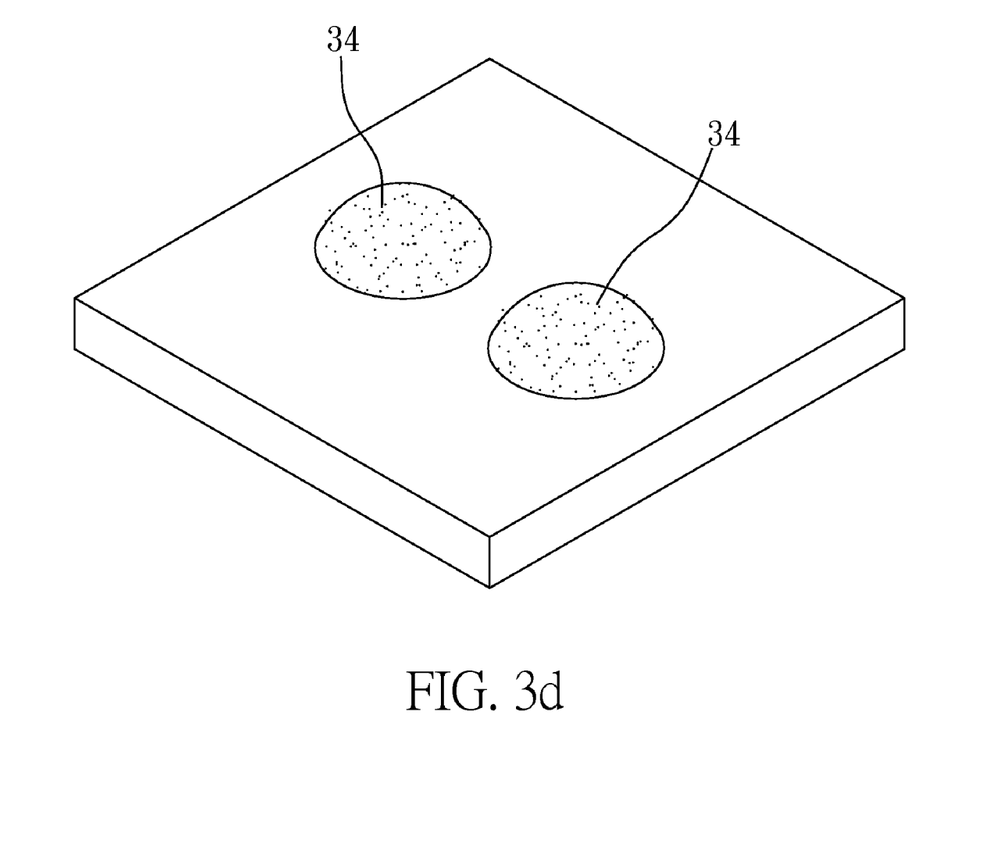
FIG. 3d is a side view of the second manufacturing step of the micro-lenses according to the present invention.

Next, FIG. 3c is a cross-sectional diagram of a second process of the micro-lens according to the present invention and FIG. 3d illustrates a side view of the second process of the micro-lens according to the present invention. As shown in FIGS. 3a and 3b, the thermal reflow process is used to thermally melt the lens material 33 as depicted in FIGS. 3a and 3b and the lens material 33 is made to appear in the thermally-melted state. The lens material in the thermally-melted state is formed into an arc shape in the defined ideal confinement due to the boundary definition and the surface tension of the micro-cavity 32, thereby forming an ideal arc-shaped micro-lens 34 as illustrated in FIGS. 3c and 3d after curing.

Figure 3E:
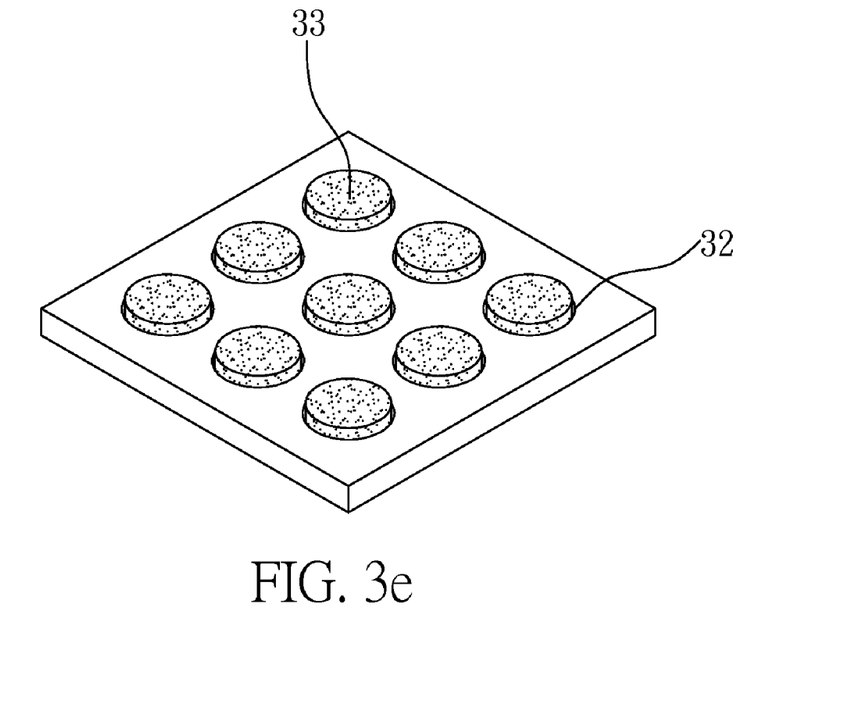
FIG. 3e is an array of micro-cavities and lens material array according to the first embodiment of the present invention.
Figure 3F:
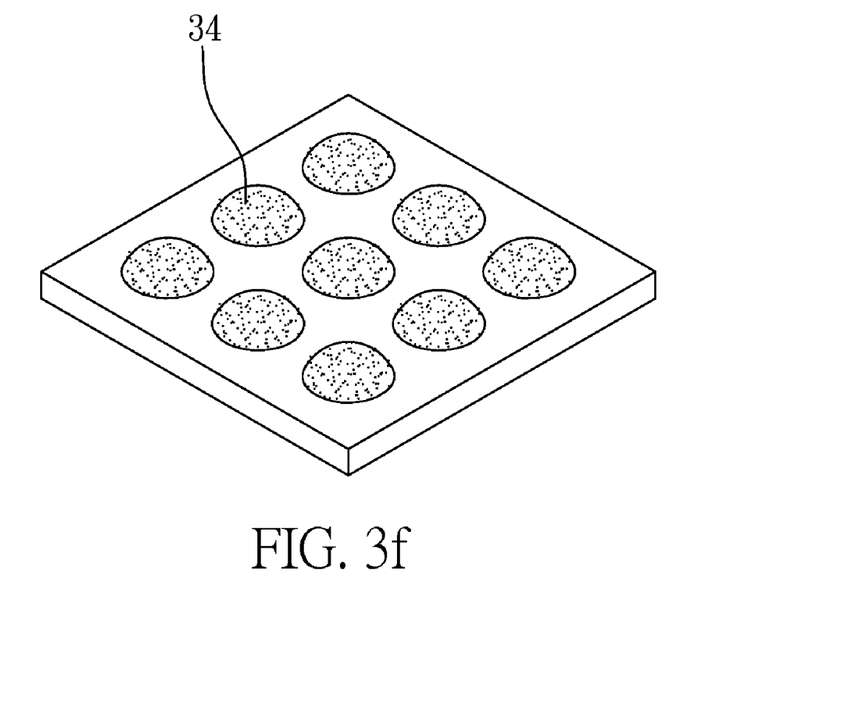
FIG. 3f is an array of micro-cavities of micro-lenses according to the first embodiment of the present invention.

Likewise, persons with common knowledge in the related art have the ability to promulgate the aforementioned micro-lens manufacturing method, arranging the plurality of micro-cavities in the micro-cavity 32 array and the lens material 33 array as depicted in FIG. 3e. After heated by the thermal reflow process, the micro-lens 34 array as shown in FIG. 3f is formed. It is to be additionally remarked that micro-cavity array and micro-lens array are designed as rectangular array, hexagonal array or arrays of any other kinds of quadrangle.

Second Embodiment

As the technical core of the present invention adds a boundary limitation structure for defining thermal material diffusion range to the micro-lens thermal reflow process, thereby solving problems such as incomplete lens thermal melting or improper thermal agglutination between adjacent microlenses when applying the conventional thermal reflow process. Hence, in the micro-lens thermal reflow process, any designs used to achieve the boundary limitation structure shall be explained as realizing designs of said micro-cavities in the present invention.

Hence, the formation of the boundary limitation structure is not only limited to the substrate etching or digging a micro-cavity structure.

For instance, the present embodiment proposes that the positive photoresist and the negative photoresist have different effects on the optical lithography in a manufacturing method that adopts photolithography process. Firstly, a set of the photomask having an array pattern is exposed to the negative photoresist layer, so as to form a pair of micro-lens array structures having the array pattern, serving as the boundary limitation structure for defining thermal material diffusion range.

Subsequently, a positive photoresist layer is formed on a negative photoresist layer having the boundary limitation structure, thereby exposing the photomask having the array pattern to the positive photoresist layer. Hence, the lens material is formed in each of the micro-cavities of the micro-cavity array using a considerably efficient method.

Figure 4:
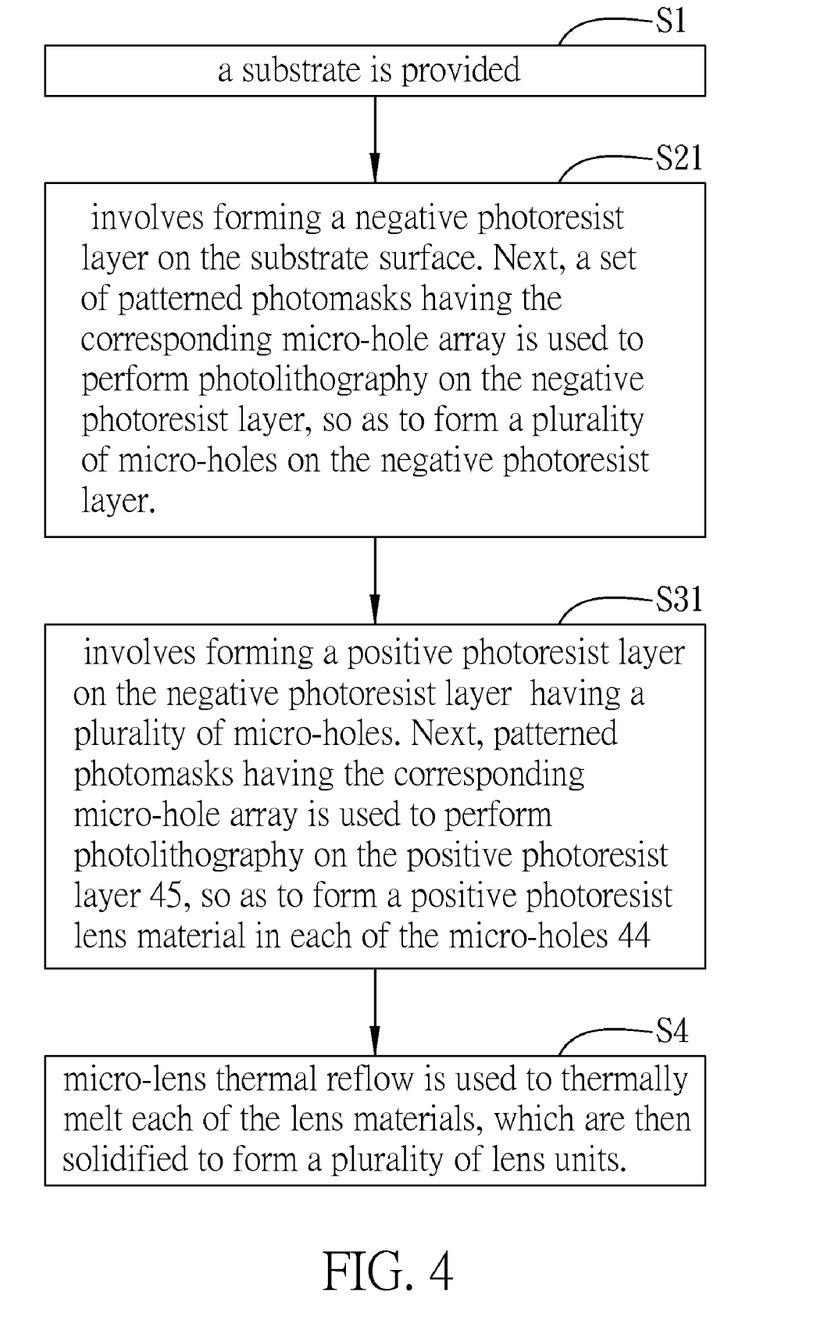
FIG. 4 is a process flow according to a second embodiment of the present invention.
Figure 5A:
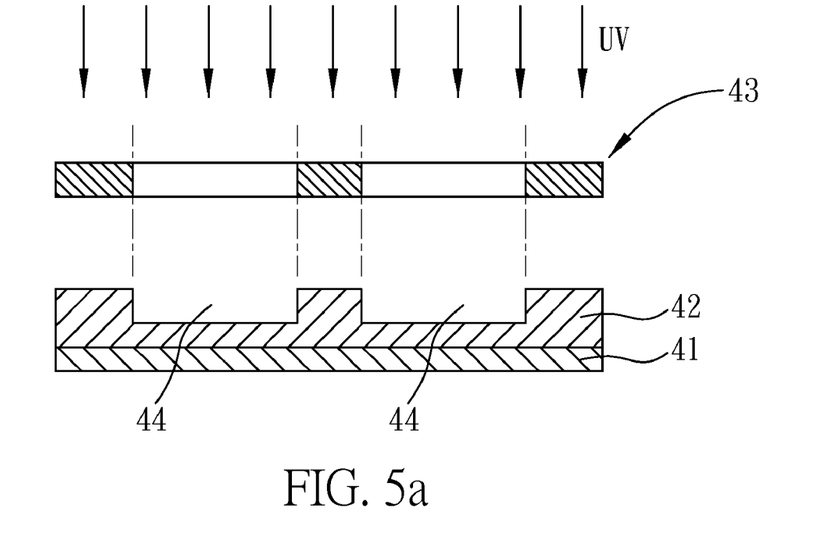
FIG. 5a is a first diagram illustrating a micro-lens process structure according to the second embodiment.
Figure 5B:
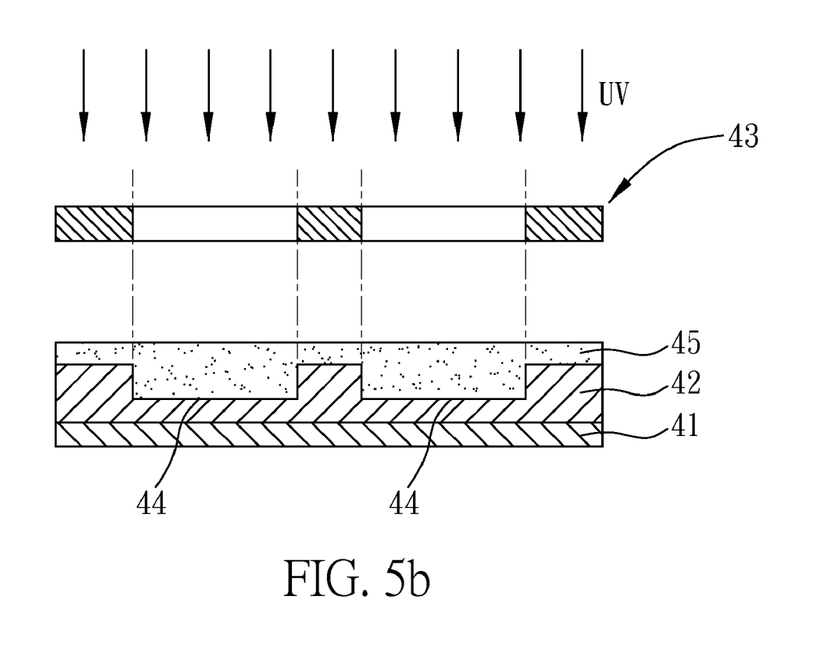
FIG. 5b is a second diagram illustrating the micro-lens process structure according to the second embodiment.
Figure 5C:
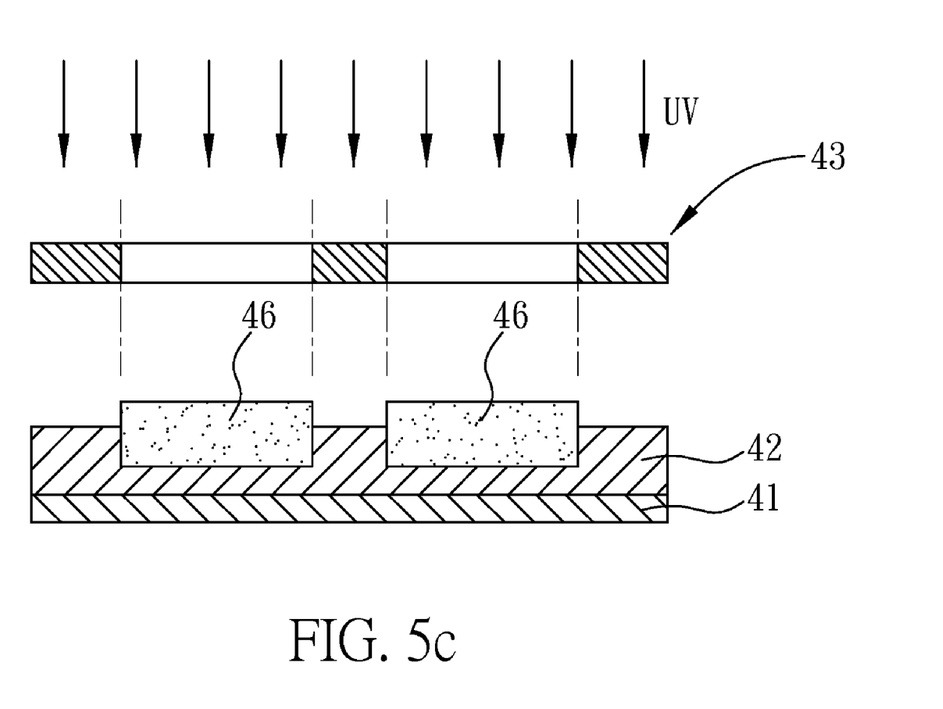
FIG. 5c is a third diagram illustrating the micro-lens process structure according to the second embodiment.

Preferably, FIG. 4 is a procedure flow according to a second embodiment of the present invention, FIG. 5a is a first diagram illustrating a micro-lens process structure according to the second embodiment, FIG. 5b is a second diagram illustrating the micro-lens process structure according to the second embodiment, and FIG. 5c is a third diagram illustrating the micro-lens process structure according to the second embodiment.

In particular, FIG. 4 is used to describe the micro-lens manufacturing method combining photolithography in details, after which step S2 of the first embodiment is realized using step S21 and step S3 of the first embodiment is realized using step S31.

In correspondence to the structure of FIG. 5a, step S21 involves forming a negative photoresist layer 42 in the substrate 41 surface. Next, a set of patterned photomasks 43 having the corresponding micro-cavity array is used to perform photolithography on the negative photoresist layer 42, so as to form a plurality of micro-cavities 44 on the negative photoresist layer 42. Proceed then to step S31. In the present embodiment, it is preferable to choose SU-8 3005 negative photoresist made by MicroChem Corp. as the negative photoresist layer 42.

In correspondence to the structure of FIG. 5b, step S31 involves forming a positive photoresist layer 45 on the negative photoresist layer 42 having a plurality of micro-cavities 44. Next, patterned photomasks 43 having the corresponding micro-cavity array is used to perform photolithography on the positive photoresist layer 45, so as to form a positive photoresist lens material 46 in each of the micro-cavities 44 as shown in FIG. 5c. In the present embodiment, it is preferable to choose AZ P4620 positive photoresist made by AZ Electronic Materials as the positive photoresist layer 45.

It is to be additionally remarked that the shape of the cross-section of the micro-cavities 44 is not limited to circle only. Also, the positive photoresist lens material 46 does not only protrude from the micro-cavities 44, the height of the positive photoresist lens material 46 can also be protruded from, aligned with or lower than the micro-cavities 44 as required.

In accordance with the above, the method for manufacturing the micro-lens disclosed by the present invention uses the concept of defining the lens thermal reflow boundary condition using micro-cavities, thereby allowing to user to clearly define the diffusion range of the lens material in each thermal state in the structure defined by the micro-cavities. After curing, an ideal micro-lens structure is then formed according to user's requirement.

Also, the technique of the present invention is applied to the thermal reflow process of the big-scale micro-lens array. In addition to being able to effectively solve the improper agglutination problem between adjacent micro-lenses resulted from thermal backflow due to high temperature, the thermal system is also heated to a thermal temperature sufficiently high enough to melt all lens materials, thereby allowing all lens materials to be thermally melted into an ideal arc-shaped micro-lens.

Agreeingly, the method for manufacturing the micro-lens as disclosed by the present invention adopts the design that confines the lens material in the thermally-melted state in the micro-cavities, thereby improving the problems of the conventional thermal reflow process like incomplete thermal melting of the micro-lens or improper agglutination between adjacent micro-lenses due to undersized gaps between adjacent micro-lenses and non-uniform micro-lens substrate temperature.

Third Embodiment

Figure 6:
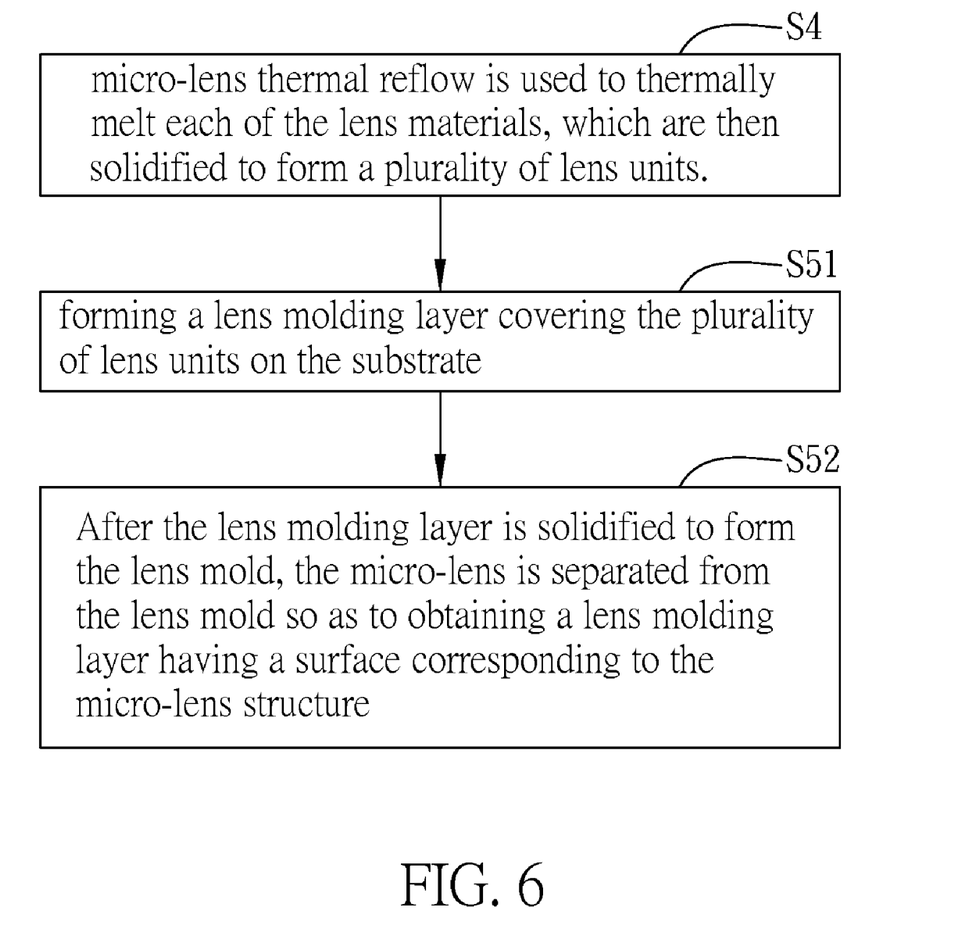
FIG. 6 shows a procedure flow according to a third embodiment of the present invention.

Referring now to FIG. 6, a procedure flow according to a third embodiment of the present invention is illustrated As shown in FIG. 6, the method for manufacturing micro-lenses according to the present invention, after step S4, further includes forming a lens molding layer covering the plurality of micro-lenses in the substrate. In addition, the micro-lens and the lens molding layer are separated to obtain a lens molding layer having a surface corresponding to the micro-lens structure.

More specifically, step S51 is about forming a lens molding layer covering the plurality of micro-lenses in the substrate. In particular, the lens molding layer can be selected from the accumulated molding layer formed a metallic carbide composed by TiN and TiAlN, Hot embossing and injection molding of high polymers such as polydimethysiloxane can also be used. After the lens molding layer is solidified to form the lens mold, proceed to step S52.

At step S52, the micro-lens is separated from the lens mold so as to obtaining a lens molding layer having a surface corresponding to the micro-lens structure. The user is then allowed to manufacture microlenses using the lens molding layer having a surface corresponding to the micro-lens structure.

While the invention has been particularly shown and described with reference to preferred embodiments for purposes of illustration, it will be understood that variations and modifications can be effected thereto by those skilled in the art without departing from the spirit and scope of the invention as defined by the appended claims.

What is claimed is:

1. A method for fabricating a micro-lens, comprising:
   forming a plurality of micro-cavities in a substrate;
   filling lens material into each of the micro-cavities;
   heating the lens material in the micro-cavities; and
   curing the lens material in the micro-cavities to form a plurality of micro-lenses in the substrate,
   wherein the step of forming the plurality of micro-cavities in a substrate further includes forming a negative photoresist layer on the substrate and performing photolithography on the negative photoresist layer by using a photomask, and the step of filling the lens material into each of the micro-cavities further includes forming a positive photoresist layer on the negative photoresist layer, and applying photolithography to the positive photoresist layer by using the photomask to form the lens material in each of the micro-lenses.

2. The method of claim 1, wherein the plurality of micro-cavities and the plurality of micro-lenses in the plurality of micro-cavities are arranged in an array.

3. The method of claim 2, wherein the anay of the plurality of micro-cavities and that of the plurality of micro-lenses are in a square form.

4. The method of claim 2, wherein the anay of the plurality of micro-cavities and that of the plurality of micro-lenses are in a hexagonal form.

5. The method of claim 1, wherein a pattern of the photomask corresponds to the plurality of micro-cavities.

6. The method of claim 5, wherein the pattern of the photomask that corresponds to the plurality of micro-cavities is an array.

7. The method of claim 6, wherein the array of the pattern of the photomask that corresponds to the plurality of micro-cavities is in a square form.

8. The method of claim 6, wherein the array of the pattern of the photomask that corresponds to the plurality of micro-cavities is in a hexagonal array.

9. The method of claim 1, wherein a melting point of the positive photoresist layer is lower than that of the negative photoresist layer.

10. The method of claim 1, wherein in the step of filling the lens material into each of the micro-cavities, the lens material protrudes from each of the micro-cavities.

11. The method of claim 1, wherein in the step of filling the lens material into each of the micro-cavities, the lens material has a height lower than or equal to the height of a surface of each of the micro-cavities.

12. The method of claim 1, wherein a horizontal cross-section of each of the micro-cavities is in a circle shape.

13. The method of claim 1, wherein a horizontal cross-section of each of the micro-cavities is in a hexagon shape.

14. The method of claim 1, wherein a horizontal cross-section of each of the micro-cavities is in a square shape.

15. A method for fabricating a micro-lens, comprising:
forming a plurality of micro-cavities in a substrate;
filling lens material into each of the micro-cavities;
heating the lens material in the micro-cavities; and
curing the lens material in the micro-cavities to form a plurality of micro-lenses in the substrate, wherein the step of heating the lens material in the micro-cavities further includes forming a lens molding layer covering the plurality of micro-lenses in the substrate (S51), and the lens molding layer is an accumulated molding layer formed by metal nitrides.

16. The method of claim 15, wherein the metal nitrides are selected from the group comprising TiN and TiAlN.

17. The method of claim 15, wherein the lens molding layer is formed by hot embossing or injection molding of polymer material.

18. The method of claim 17, wherein the polymer material is polydimethylsiloxane.

* * * * *